United States Patent [19]
Dautremont-Smith et al.

[11] Patent Number: 5,486,263
[45] Date of Patent: Jan. 23, 1996

[54] ETCHING A DIAMOND BODY WITH A MOLTEN OR PARTIALLY MOLTEN METAL

[75] Inventors: William C. Dautremont-Smith, Westfield, N.J.; John E. Graebner, New York, N.Y.; Sungho Jin, Millington; Avishay Katz, Westfield, both of N.J.

[73] Assignee: AT&T Bell Laboratories, Murray Hill, N.J.

[21] Appl. No.: 908,130

[22] Filed: Jul. 2, 1992

[51] Int. Cl.$^6$ .................................................. H01L 21/00
[52] U.S. Cl. ............................... 216/33; 156/60; 216/96; 216/46
[58] Field of Search .................................. 156/625, 628, 156/650, 629, 60

[56] References Cited

FOREIGN PATENT DOCUMENTS

| | | |
|---|---|---|
| 63-144940 | 6/1988 | Japan . |
| 2061904 | 5/1981 | United Kingdom . |
| 426371 | 5/1991 | United Kingdom . |

OTHER PUBLICATIONS

Graebner, J. E. et al., *Appl. Phys. Lett.*, "Unusually High Thermal Conductivity in Diamond Films," vol. 60, pp. 1576–1578 (Mar. 30, 1992).

Jin, S. et al., "Massive Thinning of Diamond Films by a Diffusion Process," *Appl. Phys. Lett.*, vol. 60, pp. 1948–1950 (Apr. 20, 1992).

Application Ser. No. 07/822,470, filed Jan. 17, 1992, J. E. Graebner Jan. 28, 1952.

"Classification of Phase Diagrams of Metal—Carbon Systems In Relation To Diamond Synthesis"; Butylenko et al.; 1977; Sint. Al mazy, (4), 19–13; abstract only.

"Importance of The Experimental Growth And Dissolution of Diamond Crystals In Metal—Carbon Systems For Understanding Some Aspects of Natural Diamond Origin"; Eksp. Issled. Mineroloobrazov. Sukkikh Okisnykh Siliket Sist.; Litrin et al.; 1972; abstract only.

"Weettability and Contact Interaction of Metallic Melts With Diamond And Cubic Baron Nitride"; Sint. Almazy Prom–Sti; Doke Nauchn. Sookstch. Sov. Zarub. Uch. Spets.; Mezhduner, Konf.; meeting Date 1971; 32–6; 1971; abstract only.

"Polishing of CVD Diamond Film"; 1991; Tzeng et al.; Applications of Diamond Films and Related Materials, pp. 241–248.

"Adhession Interaction And Contact Eutectic Melting of Diamond With Metals"; Sin Almazag, 3(6), 1971, abstract only.

"Development and Performance of A Diamond Film Polishing Apparatus With Hot Metals"; S.P.I.E., vol. 1325; Diamond Optics; 1990; Yoskikawa; pp. 210–219.

"Diamond Growth Rates"; 1971; J. Phys. Chem., 75(12); Wentorf; pp. 1833–1837.

*Primary Examiner*—George Goudreau
*Attorney, Agent, or Firm*—David I. Caplan

[57] ABSTRACT

A diamond body, such as a CVD diamond film, is etched by immersion of the body in a molten or partially molten metal, such as the rare earth metal La or Ce. While the body is being etched, various portions of a major surface of the body can be protected for various time durations by masks against the etching—whereby, after dicing the body, the resulting dies can be used as submounts for lasers with feedback.

18 Claims, 1 Drawing Sheet

ETCHING A DIAMOND BODY WITH A MOLTEN OR PARTIALLY MOLTEN METAL

TECHNICAL FIELD

This invention relates to methods of etching, and more particularly to methods of removing material from a diamond body.

BACKGROUND OF THE INVENTION

A diamond body, including a free-standing (stand-alone) CVD (chemical vapor deposited) diamond film, is useful in a variety of contexts, such as a heat-spreading submount for a semiconductor laser chip or a semiconductor integrated circuit chip. Presently available free-standing CVD films typically exhibit an undesirably relatively rough (large grain) top surface and a relatively smooth (small grain) but undesirably relatively low thermal conductivity bottom surface. The thermal conductivity thus has a gradient going from the top to the bottom surface. As described in a paper by J. E. Graebner et al., published in *Applied Physics Letters*, Vol. 60, pp. 1576–1578 (Mar. 30, 1992), entitled "Unusually High Thermal Conductivity in Diamond Films," this gradient is believed to be attributable to a cone-shaped columnar crystal structure of the film, the cones having their vertices located at or near the bottom surface of the film at its interface with an underlying substrate on which the film has been grown. Those of the columnar cones that extend all the way to the top surface of the film have less sub-structure than those that do not. This type of microstructure causes an undesirably low average transverse (spreading) thermal conductivity of the diamond film at its bottom regions, as well as poor thermal contact with, for example, a laser chip located on the rough top surface of the diamond film. Likewise, there can arise a problem of poor thermal contact of the rough bottom surface of the diamond film with a metallic or ceramic heatsinking mount. Thus, removal of a thickness of diamond material from its top and bottom surfaces is desirable.

The paper "Massive thinning of diamond films by a diffusion process," authored by S. Jin et al, and published in *Applied Physics Letters*, Vol. 60, pp. 1948–1950 (20 Apr. 1992) teaches a technique for removing diamond material simultaneously from top and bottom regions of a free-standing CVD diamond film, in order to smoothen the top surface and at the same time to remove undesirably low thermal conductivity material located at the bottom surface. In accordance with that technique, the free-standing diamond film is sandwiched between a pair of thin iron sheets (foils) and heat treated at 900° C. under a constant stress for a time duration of 48 hours in an argon gas atmosphere. Although the technique is useful for its intended purpose, namely, thinning the CVD diamond film by approximately 100 μm (50 μm on each main face), a shorter time duration would be desirable, especially from an economic standpoint. Furthermore, the required application of high pressure (typically approximately 20 MPa for the case of etching with iron), to ensure good contact between the solid metal and diamond surfaces during heat treatment, is not desirable from an industrial point of view. Therefore, a faster and lower-pressure method of removing (diamond) material from a face of diamond body is desirable, at little or no sacrifice of surface smoothness (if not gain in surface smoothness).

SUMMARY OF THE INVENTION

In order to reduce the time required for thus removing material from a face of a diamond body—such as, for example, for thinning a free-standing CVD diamond film—in accordance with the invention we provide a method comprising the steps of (a) maintaining at least a portion of the face in direct physical contact with a molten or partially molten material comprising a rare earth metal or a rare earth metal mixture, that dissolves carbon; and (b) maintaining the molten or partially molten material within a temperature range between about 700° C. and about 1300° C., whereby a thickness of the body located at the portion of the face thereof is removed.

In this way, the required time duration can be reduced by a factor of approximately 5 or more, and the required pressure can be reduced by a factor of as much as 100 or more. For example, it is advantageous that during step (b) a pressure of less than approximately 0.2 MPa, preferably less than 0.02 MPa, is applied to the molten or partially molten material. At the same time the smoothness of the top surface of a CVD diamond film can be improved.

Although it should be understood that any advantage of this invention does not depend on the correctness of any theory, it is believed that the required time duration of the etching process of this invention is thus reduced because diffusion of carbon in molten or partially molten material is a speedier process than the diffusion of in solid metal.

It is further advantageous that more than one diamond body thus be simultaneously maintained in contact with sandwiched layers or a bath formed by the molten or partially molten material, in order to achieve batch processing. It is also advantageous that the rare earth be lanthanum and that the temperature range have a lower limit of approximately 800° C. and an upper limit of approximately 1300° C., preferably a lower limit of approximately 900° C. and an upper limit of approximately 1000° C. As an alternative to lanthanum, it is also advantageous that the rare earth be cerium and that the temperature range have a lower limit of approximately 700° C. and an upper limit of approximately 1300° C., preferably a lower limit of approximately 800° C. and an upper limit of approximately 1000° C.

It is also advantageous that, prior to and during the above-recited steps (a) and (b), a selected portion of the face is masked by a protective layer that inhibits or suppresses any removal of (diamond) material from the diamond body in regions of the body underlying the protective layer. In this way the face of the body becomes patterned into two portions: an unetched portion and an etched portion. It is still further advantageous to remove the protective layer after step (b) has been completed.

It is also advantageous that, following the steps (a) and (b), an electronic device, such as a laser device, is bonded to the portion of the face. It is further advantageous that, following the steps (a) and (b), a heat-sinking body, typically of metal, is bonded to the body.

It is still further advantageous that during steps (a) and (b) a first portion (31 and 32) of the face of the body is masked by a protective layer for a first prescribed time duration and a second portion (32) of the face of the body remains masked by a protective layer for a second prescribed time duration, the first and second portions (31, 32) of the face being spaced apart—whereby first, second, and third subfaces (31, 32, 33) are formed with a first sidewall surface (35) located contiguous with the first and third subfaces (31, 33) and with a second sidewall surface (34) located contiguous with the second and third subfaces (32, 33). It is yet further advantageous that the protective layer be removed after the first, second, and third subfaces have thus been formed, and that a first device be attached to the first subsurface and a second device be attached to the second sidewall. It is still further advantageous that the first device is a laser and that the second device is a photodetector.

BRIEF DESCRIPTION OF THE DRAWING(S)

FIG. 1 is an elevational view in cross section of a diamond film being etched in accordance with a specific embodiment of the invention; and FIG. 2 is an elevational view in cross section of a shaped diamond die that has been cut from a diamond film, together with a laser and a photodetector mounted on the shaped die, in accordance with another specific embodiment of the invention.

Only for the sake of clarity none of the drawings is to any scale.

DETAILED DESCRIPTION

Figure 1:
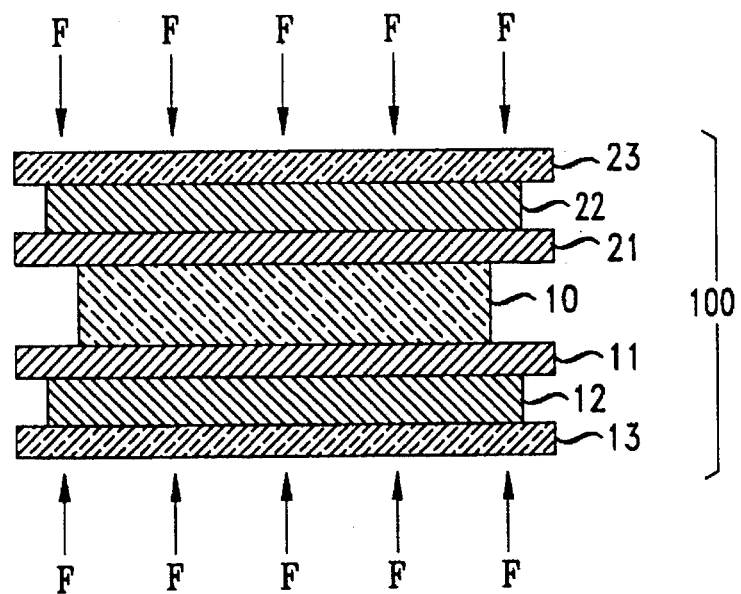

A free-standing CVD diamond film 10 (FIG. 1) whose top and bottom surfaces are to be etched, is sandwiched between a pair of flat metallic layers 11 and 21. Advantageously, the metallic layers 11 and 21 are both made of the same rare earth metal, such as cerium or lanthanum.

The sandwich is located between a pair of flat chemically or nonreactive buffer layers 12 and 22—for example, molybdenum—and a pair of flat plates 13 and 23—for example, alumina. Typically each of the buffer layers 12 and 22 has a thickness of approximately 20 μm; and typically each of the flat plates 13 and 23 has a thickness of approximately 500 μm. The purpose of the buffer layers 12 and 22 is to prevent reaction of rare earth or other metal with the alumina, especially at the elevated temperatures to be used for melting or partially melting the metallic layers 11 and 21. The purpose of the flat plates 13 and 23 is to supply rigid mechanical support.

The resulting assembly 100 is subjected to a relatively small compressive forces F, to produce a pressure p of typically less than approximately 0.2 MPa, preferably less than approximately 0.02 MPa, and in any event sufficient to produce a mechanically stable assembly and to promote uniformly good wetting of the top and bottom surfaces of the diamond film 10 when the metallic layers 11 and 21 are heated to an elevated temperature T and thereby become molten or at least partially molten. At this elevated temperature T, the molten metal wets the diamond surface and begins to react with it, and thus further application of the pressure p is not necessary but optionally the pressure p can continue to be applied. Thereby carbon is dissolved from both top and bottom faces of the diamond film 10. Hence the thickness of the film 10 is reduced when the assembly 100 is heated to the elevated temperature T; i.e., the film is etched by heating it to the elevated temperature T, as is desired.

EXAMPLE 1

The CVD diamond film 10 had a thickness of approximately 240 μm prior to the etching, and a top and (rectangular) surface area of approximately 1.0 cm×0.5 cm=0.5 cm². The metallic layers 11 and 21 were both lanthanum having an initial thickness of approximately 300 μm. The forces F were adjusted to produce a pressure p of approximately 0.008 MPa. The assembly 100 was heated in an argon atmosphere in a furnace (not shown) to an elevated temperature T that was approximately equal to 920° C. The furnace, with the assembly inside, was maintained at this temperature T for (an etching time duration of) approximately 4 hours, and then the furnace was cooled to room temperature. The diamond film 10, with reacted lanthanum on its top and bottom surfaces, was then wet etched in warm nitric acid, typically approximately 50 molar percentum nitric acid at a temperature in the approximate range of 50° C. to 60° C., typically for 0.5 hour, in order to remove any residual lanthanum in the film 10. The diamond film 10 was then washed and dried.

As a result of the foregoing procedure, the final thickness of the diamond film 10 became equal to approximately 195 μm, that is, a thickness reduction that was approximately equal to (240 μm–195 μm)=45 μm. At the same time, surface roughness of the top surface of the film 10 was significantly reduced, and there was essentially no loss of thermal conductivity.

EXAMPLE 2

Instead of lanthanum, cerium was used as the rare earth metal for the metallic layers 11 and 21, and these layers had an (initial) thickness of approximately 250 μm each. The furnace was maintained at the elevated temperature of approximately T=920° C. for (an etching time duration of) approximately 16 hours. All other parameters were the same as recited in Example 1 above. In this way, the thickness reduction was approximately equal to 60 μm. Again the top surface roughness was significantly reduced, and thermal conductivity remained essentially unchanged.

Figure 2:
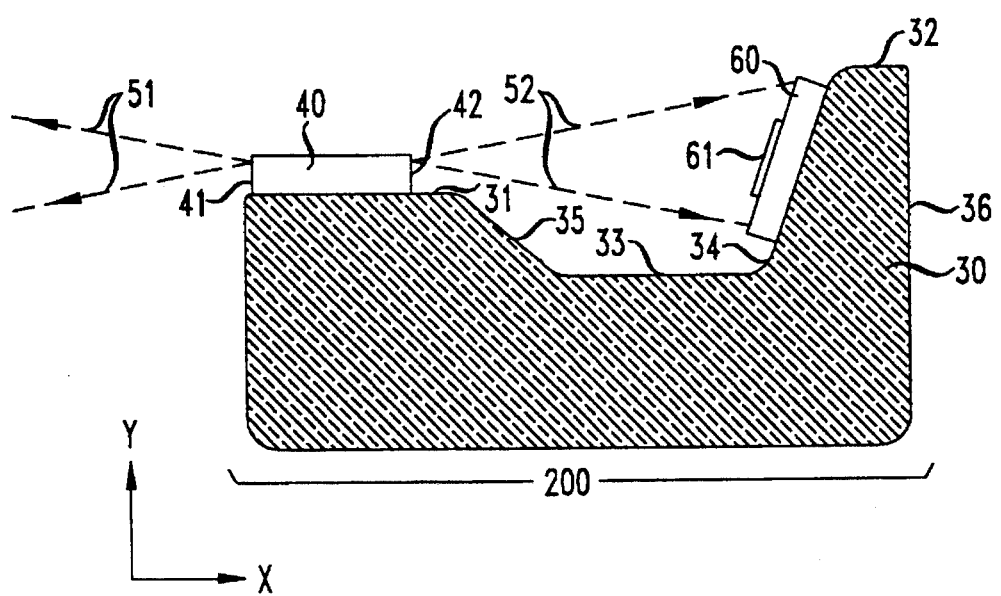

Referring now to FIG. 2, a laser device assembly 200 contains a laser device 40, as well as a photodetector device 61 for supplying feedback to the laser device. Electrical wiring (not shown) and details of the devices (not shown) can be standard in the art. The photodetector device 61 is mounted on a photodetector substrate 60 which is attached to a slanting sidewall 34 of a shaped CVD diamond die 30. This shaped diamond die 30 serves as a submount for the laser device 40.

The laser device 40 is attached to an intermediately high, horizontal subface 31 of the shaped diamond die 30. During laser operation, this laser device 40 emits through its frontside edge 41 a frontside beam 51, and through its backside edge 42 a backside beam 52. The photodetector device 61 is aligned so that its photodetecting surface is completely bathed in the backside beam 52. The right-hand edge surface 36 of the die 30 typically is bonded to a standard, thermally conducting metallic header (not shown), in order to conduct heat away from the assembly 200 during operation of the laser device 40.

In order to fabricate the shaped CVD diamond die 30, a CVD diamond film (not shown) with parallel top and bottom faces is masked with a protective layer everywhere except at areas overlying a lowest subface 33 and is subjected to the above-described etching for a prescribed time duration. The term "top face" here refers to the "growth" face, i.e., the face that was exposed when the diamond film was originally grown on a substrate. The protective layer for the masking can be a high-melting-point refractory metal such as molybdenum, tantalum, or tungsten, or any other metal that does not react either with the diamond or with the molten (or partially molten) metal. Then the remaining diamond film is unmasked at areas overlying intermediately high subface 31 and is subjected to further such etching for another prescribed time duration. Finally the remaining film is unmasked everywhere and is optionally subjected to still further such etching in order to remove (diamond) material from all bottom and top surfaces of the film. In this way, the shaped die 30 is formed, with the sidewall surface 34 running between a highest subface 32 and a lowest subface 33, and with another sidewall surface 35 running between the lowest subface 33 and the intermediately high subface 41. The laser device 40 and the photodetector device 61 can then be bonded into place as shown in FIG. 2. Advantageously, a metallic heat-sinking body (not shown) is bonded to the shaped die 30, preferably to the right-hand edge surface 36, or to the bottom surface (or to both of these surfaces), of the shaped die 30.

It should be understood that many similar if not identical shaped dies like the shaped die 30 can be made simultaneously from a two-dimensional array that was originally formed in a single original (large surface area) diamond film having an area that is sufficiently large to accommodate them. After patterning this film, its (many) intermediately high subfaces 31 and its (many) sidewall surfaces 34 can all be simultaneously metallized for subsequent bonding of the (many) laser devices 40 and the (many) photodetector substrates 60. Advantageously, for electrical isolation purposes this metallizing can be performed by means of a sputtering beam directed along a fourth quadrant angle in the XY plane, in order to avoid deposition on the sidewall surfaces 35 and the lowest subfaces 33—by utilizing shadow effects. Thereafter, the thus metallized original film can be cut along its edge surfaces 36 as by laser dicing, into stripes. Next, the resulting edge surface 36 can be metallized for bonding to the metallic header (not shown). Thereafter, the stripes can be further cut along planes parallel to the XY plane, in order to arrive at the desired size of individual pieces, each of which can be used as the shaped diamond die 30.

Although the invention has been described in detail with respect to specific embodiments, various modifications can be made without departing from the scope of the invention. For example, when using lanthanum for the metallic layers 11 and 21, the elevated temperature T can be in the approximate range of 800° C. to 1300° C.

The lower limit of approximately 800° C. is chosen as it is the partial melting temperature of lanthanum when some carbon is dissolved in it. The upper temperature of approximately 1300° C. is chosen for the sake of convenience in industrial heat treatment processing. The use of still higher processing temperatures under specific conditions is not excluded. Within the approximate range of 800° C. to 1300° C., higher processing temperatures provide increased solubility of carbon in lanthanum as well as enhanced kinetics and hence shorter processing time durations. The melting temperature of pure lanthanum is approximately 918° C., that is, approximately 118° C. higher than the lower limit of 800° C. for the elevated temperature T. From the viewpoint of convenience and efficiency of etching, the preferred temperature range for T, when using lanthanum, is between 900° C. and 1000° C.

When using cerium for the metallic layers 11 and 21, the elevated temperature T can be in the approximate range of 700° C. to 1300° C., the melting temperature of cerium being approximately 798° C., that is, approximately 98° C. higher than the lower limit of approximately 700° C., which is the partial melting temperature of the cerium when some carbon is dissolved in it. Thus the respective temperature ranges for lanthanum and cerium have lower limits that are higher than approximately 118° C. and 98° C., respectively, below the respective melting temperatures.

Instead of using argon, other inert or reducing atmospheres, such as helium or hydrogen, can be used. Alternatively, a mixture of hydrogen and methane ($CH_4$) can be used. Also, other rare earth metals can be used, such as yttrium. Furthermore, the rate of dissolution of the diamond film can be controlled to a more nearly constant rate, by continuous removal of the dissolved carbon as volatile methane, by means of permeating or bubbling hydrogen through the molten rare earth while the film is suspended or otherwise immersed in the molten rare earth metal in a container under a prescribed pressure. The substraw (not shown) on which the diamond film was originally grown can remain intact or partly intact on the bottom surface of the film, if needed.

More than one diamond body can be simultaneously etched by using either a molten bath of the metal or by a configuration of sandwiched layers of molten or partially molten metal between stacked films of diamond.

Desirable etching time durations can be in the approximate range of 0.01 to 1000 hours, preferably 0.1 to 100 hours, depending on the elevated temperature T and the desired amount of reduction in thickness of the diamond film.

After the etching has been completed and the diamond film has been taken out of the furnace, any residual unreacted or reacted metal can be removed by chemical etching or mechanical polishing. The etched diamond surface can be given additional finishing processing steps, such as local-area or entire-area mechanical or laser polishing, to achieve smoother surfaces or to impart fine geometrical patterns.

The technique of this invention may also be applied to single crystalline or polycrystalline diamond pieces, natural or synthetic, for the purpose of shaping or patterning.

Instead of a laser device, a semiconductor integrated circuit device can be mounted on the etched and polished diamond film serving as a submount, with the diamond film being bonded to the metallic heat-sinking body. In such a case the etching of the diamond film need not be patterned; that is, the entire top face of the film can be planar.

What is claimed is:

1. A method of removing a thickness of material from a diamond body having at least one face, including the steps of (a) maintaining at least a portion of the face in direct physical contact with a molten or partially molten material comprising a rare earth metal or a rare earth metal mixture that dissolves carbon; and (b) maintaining the molten or partially molten material, within a temperature range between about 700° C. and about 1300° C., whereby a thickness of the body located at the portion of the face thereof is removed.

2. The method of claim 1 in which the mixture comprises lanthanum and cerium.

3. The method of claim 1 in which the rare earth is lanthanum.

4. The method of claim 3 in which the lower limit is about 900° C. and the upper limit is about 1000° C.

5. The method of claim 1 in which the rare earth is cerium.

6. The method of claim 5 in which the lower limit is about 800° C. and the upper limit is about 1000° C.

7. The method of claim 1 in which prior to and during step (a) a selected portion of the face is and is maintained, respectively, masked by a protective layer that suppresses removing of material from the diamond body in regions thereof underlying the protective layer, whereby the face of the body becomes patterned.

8. The method of claim 1 in which during steps (a) and (b) a first portion of the face of the body is masked by a protective layer for a first time duration and a second portion of the face of the body remains masked by a protective layer for a second time duration, the first and second portions of the face being spaced apart, whereby first, second, and third subfaces are formed with a first sidewall surface located contiguous with the first and third subfaces, and with a second sidewall surface located contiguous with the second and third subfaces.

9. The method of claim 8 further including the steps of removing the protective layer, attaching a first device to the first subface and attaching a second device to the second sidewall surface.

10. The method of claim 9 in which the first device comprises a laser and the second device comprises a photodetector.

11. The method of claim 1 in which the molten or partially molten metal or the carbon-containing alloy forms a bath, and steps (a) and (b) are simultaneously performed with another diamond body while it is located in the bath.

12. The method of claim 1 in which the molten or partially molten metal or the carbon-containing alloy forms layers sandwiched between multiple films of diamond, whereby steps (a) and (b) are performed on all the films simultaneously.

13. The method of claim 12 in which during step (b) a pressure is applied that is less than about 0.2 MPa.

14. The method of claim 11 in which during step (b) a pressure is applied that is less than about 0.02 MPa.

15. The method of claim 1 further including, following the step (b), the step of bonding an electronic device to the portion of the face.

16. The method of claim 15 further including, following the step (b), the step of bonding a heat-sinking body to the diamond body.

17. The method of claims 1, 2, 6, 7, 8, 9, 10, 11, 12, 13, 14, 15, or 16 further including the step of forming the diamond body by means of a chemical vapor deposition step.

18. The method of claims 1, 2, 6, 7, 8, 9, 10, 11, 12, 13, 14, 15, or 16 in which the diamond body is polycrystalline.

* * * * *